(12) United States Patent
Cheng

(10) Patent No.: US 7,990,730 B2
(45) Date of Patent: Aug. 2, 2011

(54) IMAGING DEVICE

(75) Inventor: Chun-Fang Cheng, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 778 days.

(21) Appl. No.: 12/061,913

(22) Filed: Apr. 3, 2008

(65) Prior Publication Data

US 2009/0129034 A1    May 21, 2009

(30) Foreign Application Priority Data

Nov. 20, 2007    (CN) .......................... 2007 1 0202596

(51) Int. Cl.
*G02B 7/02* (2006.01)
*H04N 1/04* (2006.01)

(52) U.S. Cl. ........ 361/748; 361/728; 361/732; 361/740; 361/752; 348/340; 348/345; 348/243; 348/274; 359/819; 359/820; 359/823; 257/666; 257/678; 257/680; 250/239; 250/372; 250/373

(58) Field of Classification Search .......... 361/728–732, 361/736, 740–748, 752, 759, 760–764, 800, 361/820; 348/39, 238.3, 340, 345, 222.1, 348/231.2, 227.1, 294, 273, 374; 359/245, 359/246, 248, 716, 793, 818, 819, 820, 822, 359/823; 250/201.1, 208.1, 330, 239, 226, 250/372, 373; 396/529, 534–541; 385/14, 385/34–39, 42, 49, 88, 89, 819–823; 439/71; 257/432, 434, E31.11, E31.124, 678, 666, 257/686, 680, 704, 723

See application file for complete search history.

(56) References Cited

U.S. PATENT DOCUMENTS

| | | | | |
|---|---|---|---|---|
| 6,654,187 B2 * | 11/2003 | Ning | ............................ | 359/823 |
| 6,741,405 B1 * | 5/2004 | Chen | ............................ | 359/813 |
| 6,977,783 B2 * | 12/2005 | Lung | ............................ | 359/819 |
| 7,061,697 B2 * | 6/2006 | Magni et al. | ................. | 359/811 |
| 7,095,621 B2 * | 8/2006 | Saimun et al. | ................ | 361/772 |
| 7,199,359 B2 * | 4/2007 | Webster | ........................ | 250/239 |
| 7,388,192 B2 * | 6/2008 | Chang et al. | .................. | 250/239 |
| 7,429,783 B2 * | 9/2008 | Cheng | ........................... | 257/678 |
| 7,456,901 B2 * | 11/2008 | Jeong et al. | ................... | 348/374 |
| 7,821,565 B2 * | 10/2010 | Wu et al. | ........................ | 348/340 |
| 2007/0236596 A1 * | 10/2007 | Sekine et al. | ................. | 348/340 |

FOREIGN PATENT DOCUMENTS

| | | | |
|---|---|---|---|
| CN | 101144887 A | | 3/2008 |
| JP | 02005176185 A | * | 6/2005 |
| JP | 02007318761 A | * | 12/2007 |
| JP | 02008187554 A | * | 8/2008 |

\* cited by examiner

*Primary Examiner* — Michael V Datskovskiy
(74) *Attorney, Agent, or Firm* — Andrew C. Cheng

(57) ABSTRACT

An imaging device includes a lens module and a printed circuit board. The lens module includes a substrate with a lens unit and an imaging sensor mounted on a same side thereof. The substrate defines a groove therein. The printed circuit board defines a recessed portion accommodating the substrate therein, and includes a locking member engaging in the groove to detachably secure the lens module thereto.

5 Claims, 3 Drawing Sheets

IMAGING DEVICE

BACKGROUND

1. Technical Field

The present invention relates to imaging devices and, particularly, to an imaging device having a detachable lens module mounted on a printed circuit board.

2. Description of Related Art

Lens modules are widely applied in electronic devices having imaging functions, such as mobile phones or personal digital assistants (PDAs). The lens module generally comprises a lens unit, an imaging sensor, and a substrate attached to a printed circuit board (PCB). The lens unit focuses light beams onto the imaging sensor. The image sensor generates image signals that are transmitted to the PCB. The substrate is typically attached to the PCB via surface mount technology, and is difficult to remove once attached.

What is needed, therefore, is an imaging device having a detachable lens module mounted on a printed circuit board.

SUMMARY

In accordance with an exemplary embodiment, an imaging device includes a lens module and a printed circuit board. The lens module includes a substrate with a lens unit and an imaging sensor mounted on a same side thereof. The substrate defines a groove therein. The printed circuit board defines a recessed portion accommodating the substrate therein, and includes a locking member engaging in the groove to detachably secure the lens module thereto.

Other advantages and novel features will be drawn from the following detailed description of at least one preferred embodiment, when considered in conjunction with the attached drawings.

BRIEF DESCRIPTION OF THE DRAWINGS

Many aspects of the present imaging device can be better understood with reference to the following drawings. The components in the drawings are not necessarily drawn to scale, the emphasis instead being placed upon clearly illustrating the principles of the present imaging device. Moreover, in the drawings, like reference numerals designate corresponding parts throughout the several views.

DETAILED DESCRIPTION OF THE EMBODIMENTS

Embodiments of the present imaging device will now be described in detail below and with reference to the drawings.

Figure 1:
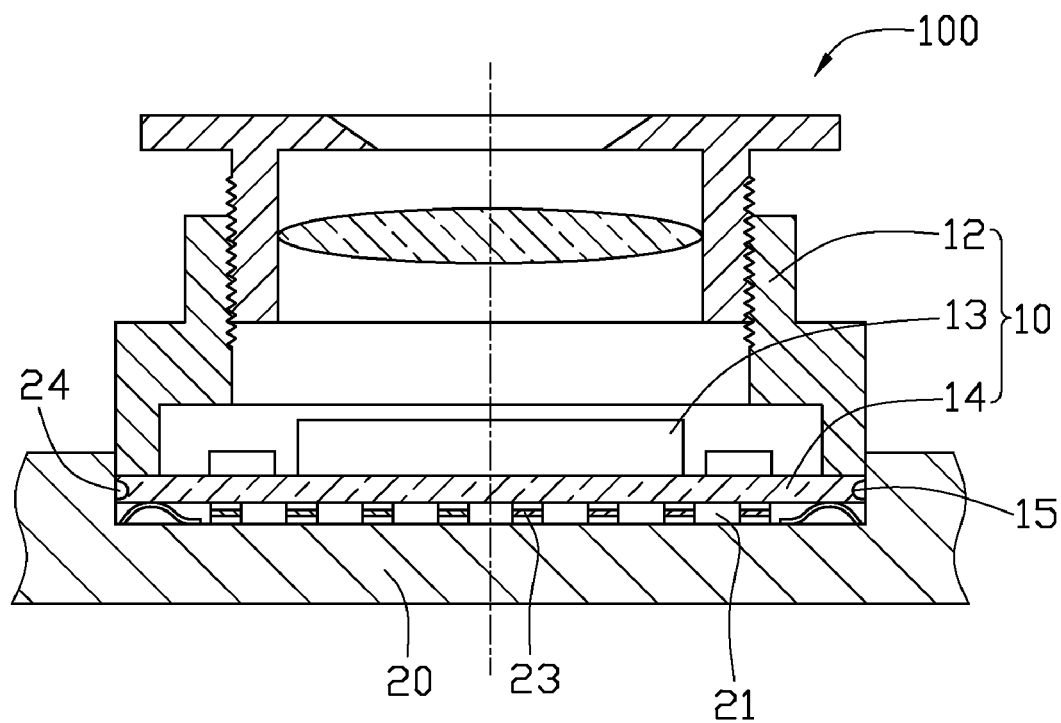
FIG. 1 is a schematic, cross-sectional view of an imaging device, according to an exemplary embodiment.

Referring to FIG. 1, an imaging device 100 according to an exemplary embodiment is illustrated. The imaging device 100 comprises a lens module 10, and a printed circuit board (PCB) 20 supporting the lens module 10 thereon.

Figure 2:
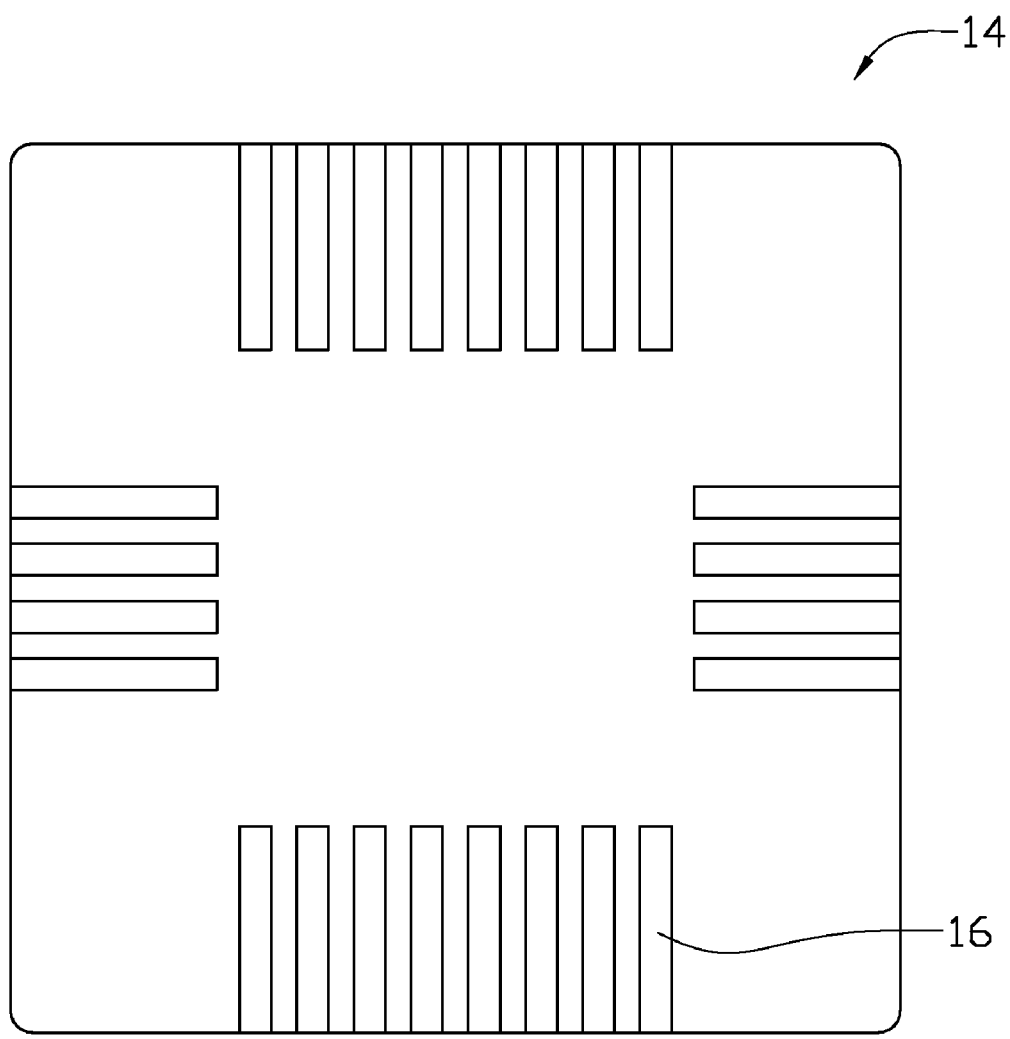
FIG. 2 is an enlarged bottom plan view of a substrate of the imaging device of FIG. 1.

Referring to FIGS. 1-2, the lens module 10 comprises a lens unit 12, an imaging sensor 13, and a substrate 14. The imaging sensor 13 is mounted on a side of the substrate 14, and housed by the lens unit 12, which is mounted on the same side of the substrate 14. The substrate 14 defines a groove 15 encircling the substrate 14 (see FIG. 1), and forms a plurality of conductive terminals 16 at an opposite side thereof (see FIG. 2).

Figure 3:
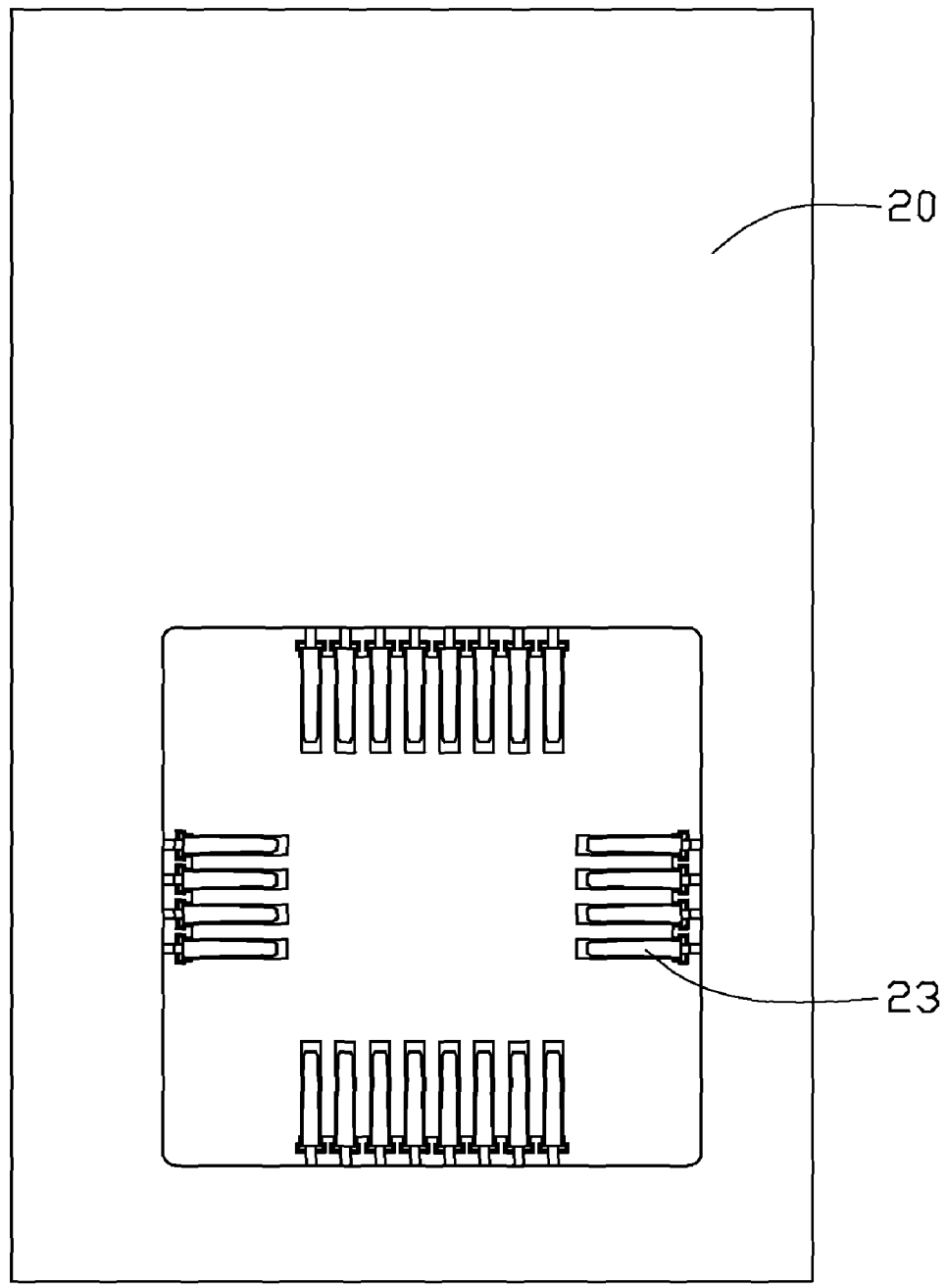
FIG. 3 is a top plan view of a printed circuit board of the imaging device of FIG. 1.

Referring to FIGS. 1-3, the PCB 20 defines a recessed portion 21 which accommodates a bottom portion of the lens module 10, especially the substrate 14, therein. A plurality of elastic conductive members 23, such as metallic leaf springs, is formed on a bottom surface of the recessed portion 21, corresponding to the conductive terminals 16. A locking member 24, such as a plurality of protrusions in the embodiment or a protruded rib in other embodiments, is formed on the PCB 20 and encircles the recessed portion 21. The locking member 24 engages in the groove 15, to detachably secure the lens module 10 to the PCB 20. The elastic conductive members 23 abut against the conductive terminals 16 of the substrate 14 respectively, thereby forming an electrical interconnection between the substrate 14 of the lens module 10 and the PCB 20. Consequently, image signals produced by the imaging sensor 13 according to light introduced via the lens unit 12, are transmitted to the PCB 20 by the conductive terminals 16 of the substrate 14 and the metallic leaf springs 23.

It will be understood that the above particular embodiments and methods are shown and described by way of illustration only. The principles and features of the present invention may be employed in various and numerous embodiments thereof without departing from the scope of the invention as claimed. The above-described embodiments illustrate the scope of the invention but do not restrict the scope of the invention.

What is claimed is:

1. An imaging device comprising:
    a lens module comprising a substrate with a lens unit and an imaging sensor mounted on a same side thereof, the substrate defining a groove therein; and
    a printed circuit board defining a recessed portion accommodating the substrate therein, and comprising a locking member engaging in the groove to detachably secure the lens module thereto.

2. The imaging device as claimed in claim 1, wherein the groove encircles the substrate and the locking member is formed in the recessed portion.

3. The imaging device as claimed in claim 2, wherein the locking member comprises a plurality of protrusions encircling the recessed portion.

4. The imaging device as claimed in claim 1, wherein the substrate forms a plurality of conductive terminals at an opposite side thereof, and the printed circuit board forms a plurality of elastic conductive members in the recessed portion, the conductive members abut against the conductive terminals respectively to form an electrical interconnection between the substrate and the printed circuit board.

5. The imaging device as claimed in claim 4, wherein the conductive members are metallic leaf springs.

* * * * *